United States Patent [19]

Goodman

[11] 4,445,129

[45] Apr. 24, 1984

[54] SEMICONDUCTOR DEVICE WITH A GRAY TIN LAYER AND A METHOD OF MAKING THE SAME

[75] Inventor: Colin H. L. Goodman, Loughton, England

[73] Assignee: International Standard Electric Corporation, New York, N.Y.

[21] Appl. No.: 303,337

[22] Filed: Sep. 18, 1981

[30] Foreign Application Priority Data

Sep. 18, 1980 [GB] United Kingdom ................. 8030268

[51] Int. Cl.³ .......................................... H01L 29/161
[52] U.S. Cl. ....................................... 357/16; 357/17; 357/61; 357/4

[58] Field of Search ................... 357/16, 61, 17, 4, 85; 156/100–105

[56] References Cited

U.S. PATENT DOCUMENTS 3,615,856  10/1971  Sommers, Jr. ........................ 357/61
3,871,017   3/1975  Pratt, Jr. .............................. 357/85

Primary Examiner—Martin H. Edlow
Attorney, Agent, or Firm—James B. Raden

[57] ABSTRACT

Epitaxial thin layers of $\alpha$-tin are grown by vapor phase epitaxy upon lattice-matched substrates of InSb or CdTe by the thermal decomposition of stannane. By using substrates of smaller lattice constant it is possible to modify the process to deposit $\alpha$-tin germanium alloys.

13 Claims, No Drawings

SEMICONDUCTOR DEVICE WITH A GRAY TIN LAYER AND A METHOD OF MAKING THE SAME

BACKGROUND OF THE INVENTION

The present invention relates to the making of semiconductive devices using semiconductive gray tin.

It has long been known that tin exists in two allotropic forms in the solid state: white tin or $\beta$-tin, the metallic form stable at room temperature; and gray tin or $\alpha$-tin, the diamond-structure non-metallic form stable at lower temperatures. $\alpha$-tin is normally a semi-metal, but a small energy gap can open up under uniaxial strain making it a semiconductor, and indeed it was the similarities between $\alpha$-tin and III-V compounds that was a primary factor leading to the development of III-V compounds as materials for semiconductor device fabrication. However, up to now $\alpha$-tin itself has not been used for this purpose partly because it has not been found possible readily to grow bulk quantities of $\alpha$-tin in single crystal form, and appropriately strained, and partly because of the difficulties imposed by the fact that $\alpha$-tin normally transforms into $\beta$-tin at around 13° C. (Bulk single crystal $\alpha$-tin cannot be prepared by cooling single crystal $\beta$-tin because the volume change occuring at the transition is so great that it disrupts the crystal structure, but it can with difficulty be grown from solution in mercury.) If these two difficulties could be overcome, $\alpha$-tin would be an attractive and useful addition to the range of semiconductor materials because (when strained) it is a direct band gap material having a relatively small band gap of about 0.1 eV. This means that it could be used to make long wavelength light emission diodes and lasers emitting in the region of 12 $\mu$m and also to make photodetectors for use at shorter wavelengths, with peak absorption at about 10 $\mu$m.

It has now been found by R. F. C. Farrow (to be reported in a paper at 8th International Vacuum Congress, Cannes, September 1980) that single crystal thin layers of $\alpha$-tin can be grown by molecular beam epitaxy upon substantially lattice matched single crystal substrates, specifically those of indium antimonide and cadmium telluride. An important practical characteristic of such layers is that they are stable up to about 70° C. against transition into $\beta$-tin. These effects are observed for layer thicknesses up to about 500 nm, but are not observed with substantially greater layer thicknesses.

SUMMARY OF THE INVENTION

Accordingly, it is a general object of the present invention to avoid the disadvantages of the prior art.

More particularly, it is an object of the invention to device a method of growing an $\alpha$-tin layer on a substrate in a simple and inexpensive way.

A further object of the invention is to develop a method by which a mixed layer of $\alpha$-tin and germanium can be formed on a substrate to produce an economical semiconductor device.

It is a concomitant object of the present invention to provide a semiconductor device having an $\alpha$-tin layer or a mixed $\alpha$-tin/germanium layer therein.

In pursuance of these objects and others which will become apparent hereafter, one feature of the present invention resides in a method of making a semiconductor device including a substrate and an active layer at the active surface, which method comprises the steps of forming a crystal lattice closely matched to that of $\alpha$-tin at least at the active surface of the substrate; and growing the active layer on the active surface by vapor phase epitaxy at least of $\alpha$-tin, including causing decomposition of stannane in a decomposition atmosphere, and exposing the active surface of the substrate to the decomposition atmosphere for deposition of tin in an $\alpha$-tin crystal lattice on the closely matched crystal lattice. Advantageously, the growing step further includes causing decomposition of germane in the decomposition atmosphere for additional deposition of germainum from the decomposition atmosphere on the closely matched crystal lattice during the exposing step. It is further advantageous when the forming step includes making the substrate as a single crystal of a material having the closely matched crystal lattice throughout.

Stannane is not believed to be in regular commercial use and thus is not commercially available. It may, however, be made in a number of ways set out in standard textbooks, such as by reacting stannic chloride in either solution with lithium aluminium hydride. Stannane decomposes slowly at room temperature but is indefinitely stable if kept cold. Therefore, the apparatus, particularly used for vapour-phase epitaxy of $\alpha$-tin is essentially the same as that used for vapour-phase epitaxy of other semiconductors, such as silicon by the thermal decomposition of silane and germanium by the thermal decomposition of germane, but with the difference that, except for the deposition zone, the whole apparatus is chilled to run at a temperature well below room temperature.

The lattice constant $a_o$ quoted for $\alpha$-tin is 0.6489 nm at 25° C. while those for indium antimonide and cadmium telluride are respectively 0.64797 and 0.64830. Thus these two materials make excellent substrate materials for growing $\alpha$-tin. A polished surface, for instance of (100) orientation, is prepared on an indium antimonide or a cadmium telluride substrate which is then placed on a heater in the epitaxy reaction vessel where the surface is cleaned to remove traces of oxide by heating at an appropriate temperature in palladium diffused hydrogen. Then, after cooling the substrate and its surroundings to room temperature, the hydrogen supply is bubbled through stannane which has been liquified by cooling. The stannane vapor thus entrained is caused to flow over the substrate which is then maintained at a slightly higher temperature than its surroundings so as to concentrate the decomposition at the substrate surface. Other hydrides such as stibine and diborane can be coreacted to effect doping.

For the construction of a typical photodetector, p-type $\alpha$-tin is grown on an n-type substrate. Electrical contacts with the structure have to be made by suitable methods not requiring temperatures high enough to transform the tin into its $\beta$ phase. These can be made for example by low temperature evaporation of for instance aluminum.

Since $\alpha$-tin appropriately strained is a direct band-gap material, quite a thin layer will strongly absorb infra-red light whose quantum energy is just greater than the band-gap of about 0.1 eV. The light can conveniently be directed on to the epitaxial layer through the substrate which is relatively transparent to this range of wavelength.

In the construction of $\alpha$-tin lasers and light emissive diodes, the large contrast between the relatively small effective mass of electrons and the relatively large effective mass of holes is useful in minimizing Auger recombination. For such devices, the large band-gap discontinuity at an α-tin/cadmium telluride interface would favor the use of cadmium telluride as the substrate material rather than indium antimonide, as would also the fact that its refractive index is lower than that of indium antimonide.

The above described process can be modified so that, by the addition of germane, the α-tin is deposited admixed in "solid solution" with a small amount of germanium. The admixture of germanium has the effect of increasing the band-gap and also of increasing thermal stability of the epitaxial layer against transformation into α-tin, thus increasing both the operational temperature range of the resulting device and the temperature range that can safely be used during manufacture. This increased stability also permits the use of thicker epitaxial layers. However, an ancillary effect of adding germanium is to reduce the lattice constant since the lattice constant of germanium at 0.5658 nm is significantly less than that of α-tin. Therefore, on an indium antimonide or cadmium telluride substrate only small amounts of germanium can satisfactorily be added. This restriction is removed by the choice of other substrate materials whose lattice constants are matched with specific points in the range of "solid solutions". Previously no extensive solid solutions of tin in germanium, or vice versa, have been found. However, it is possible to stabilize thin layers of certain α-tin germanium compositions by deposition upon "lattice matched" substrates. Examples of suitable lattice matching substrate materials for such solid solutions in the region of $\alpha\text{-Sn}_{0.5};\text{Ge}_{0.5}$ include gallium antimonide, indium arsenide, and certain ternary compounds such as zinc tin diarsenide. There can be advantage in turning to tetragonal derived diamond lattice crystals such as those of chalcopyrite structure, for example cadmium tin diarsenide, on account of their departure from pseudo-cubic symmetry. with these, the difference between the $a_O$ and $c_O/2$ lattice constants provide different effective lattice parameters for the different crystal planes which can be used to optimize growth of α-tin and of specific α-tin germanium compositions.

In respect particularly of photodetectors, a special wavelengths range of interest lies in the region of 2.5 to 5 μm. At least part of this range lies too deep into the infra-red to be reached by devices made of the direct band-gap material gallium antimonide and hence there has been much research into smaller band-gap direct materials based on indium antimonide, indium arsenide and mercury cadmium telluride and related alloys. It is believed that alloys of α-tin and germanium should provide an advantageous alternative direct band-gap material for such photodetectors since the transition from direct band-gap material of alloys rich in tin to indirect band-gap material of alloys rich in germanium occurs at about 0.5 eV.

The foregoing description has related exclusively to promoting the decomposition of the reagents solely by the action of heat. Germane is stable at much higher temperatures than stannane and so it may be advantageous, particularly when a significant proportion of germane needs to be decomposed, to assist the decomposition electrically, for instance by glow discharge. Under these circumstances it is desirable to arrange the substrate potential in such a way as to minimize the risk of disruption of the epitaxial growth process by the bombardment of the substrate with high energy ions produced in the discharge. Alternatively or additionally, decomposition can be assisted by irradiation with ultra-violet light. This is also useful for assisting the decomposition of diborane.

The application of the invention is to be understood not to be limited solely to photo-emitters and photodetectors. Thus for instance novel Hall-effect devices can be made. In this context, it is to be noted that in the range of alloys of α-tin and germanium having band-gaps approaching the maximum for direct band-gap material, beyond which the alloys are indirect, the band structure will somewhat resemble that of gallium antimonide.

Gallium antimonide does not make a good Hall effect material because the direct and indirect minima in the conduction band lie so close together in energy level that it is not possible to confine donors to the direct minimum, particularly because it is not possible to grow the material with light n-type doping. With α-tin germanium alloys, this doping problem is avoided, and furthermore there is the advantage that, compared with III-V materials, in silicon, germanium and tin there is negligible charge separation, and hence optical scattering is reduced. Such solid solutions will, however, show alloy scattering but this is likely to be reduced by ordering near for example the 50:50 composition, such effects being promoted by the disparity in size between atoms of tin and those of germanium.

While I have described above the principles of my invention in connection with specific apparatus, it is to be clearly understood that this description is made only by way of example and not as limitation to the scope of my invention as set forth in the accompanying claims.

I claim:

1. A semiconductor device comprising a substrate having an active surface and a crystal lattice closely matched to that of α-tin at least at said active surface; and vapor-phase epitaxially grown active layer of at least α-tin on said active surface of said substrate.

2. The semiconductor device as defined in claim 1, wherein said active layer further includes germanium.

3. The semiconductor device as defined in claim 2, wherein the proportion and distribution of α-tin and germanium in said layer are such as to make the layer material a direct band-gap material.

4. The semiconductor device as defined in claim 1, wherein said substrate is a single crystal of a material having said closely matched lattice throughout.

5. The semiconductor device as defined in claim 4, wherein said material is indium antimonide.

6. The semiconductor device as defined in claim 4, wherein said material is cadmium telluride.

7. The semiconductor device as defined in claim 4, wherein said material is indium arsenide.

8. The semiconductor device as defined in claim 4, wherein said material is gallium antimonide.

9. The semiconductor device as defined in claim 4, wherein said material is cadmium tin di-arsenide.

10. The semiconductor device as defined in claim 1, for use in the infra-red photodetector.

11. The semiconductor device as defined in claim 1, for use in an infra-red light emitter.

12. The semiconductor device as defined in claim 1, for use in an infra-red laser.

13. The semiconductor device as defined in claim 1, for use in a Hall-effect device.

* * * * *